United States Patent
Yoo

(10) Patent No.: US 9,318,482 B2
(45) Date of Patent: Apr. 19, 2016

(54) SEMICONDUCTOR DEVICES HAVING HIGH-RESISTANCE REGION AND METHODS OF FORMING THE SAME

(71) Applicant: Samsung Electronics Co., Ltd., Suwon-si (KR)

(72) Inventor: Jae-Hyun Yoo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/677,289

(22) Filed: Apr. 2, 2015

(65) Prior Publication Data

US 2016/0064375 A1    Mar. 3, 2016

(30) Foreign Application Priority Data

Aug. 29, 2014  (KR) .................. 10-2014-0114480

(51) Int. Cl.
| | | |
|---|---|---|
| *H01L 23/58* | (2006.01) |
| *H01L 27/02* | (2006.01) |
| *H01L 29/06* | (2006.01) |
| *H01L 29/10* | (2006.01) |
| *H01L 29/36* | (2006.01) |
| *H01L 29/866* | (2006.01) |

(52) U.S. Cl.
CPC ........ *H01L 27/0288* (2013.01); *H01L 27/0255* (2013.01); *H01L 27/0259* (2013.01); *H01L 29/0642* (2013.01); *H01L 29/0692* (2013.01); *H01L 29/1095* (2013.01); *H01L 29/36* (2013.01); *H01L 29/866* (2013.01)

(58) Field of Classification Search
CPC .................................................. H01L 27/0288
USPC ......................................................... 257/491
See application file for complete search history.

(56) References Cited

U.S. PATENT DOCUMENTS

| | | |
|---|---|---|
| 6,653,689 B2 | 11/2003 | Okawa |
| 6,831,334 B2 | 12/2004 | Okawa et al. |
| 8,218,276 B2 | 7/2012 | Mallikarjunaswamy |
| 8,252,656 B2 | 8/2012 | Whitfield et al. |
| 8,531,005 B2 | 9/2013 | Whitfield et al. |

FOREIGN PATENT DOCUMENTS

KR          2001019288          3/2001

*Primary Examiner* — Anthony Ho
(74) *Attorney, Agent, or Firm* — Onello & Mello, LLP

(57) ABSTRACT

Provided are an electrostatic discharge (ESD) protection device having a high-resistance region and a method of forming the same. The device includes a well on a substrate. A first impurity region is formed on the well and connected to an input/output pad. A second impurity region is formed on the well, spaced apart from the first impurity region, and connected to a ground (Vss). A third impurity region is formed on the well, spaced apart from the first impurity region, and connected to the ground (Vss). An isolation layer is formed between the first impurity region and the second impurity region. A high-resistance region, which directly contacts the first impurity region and the well and has a resistance higher than the first impurity region, is formed between the first impurity region and the isolation layer. The well and the third impurity region include first conductive type impurities. The first impurity region and the second impurity region include second conductive type impurities different from the first conductive type impurities.

17 Claims, 15 Drawing Sheets

SEMICONDUCTOR DEVICES HAVING HIGH-RESISTANCE REGION AND METHODS OF FORMING THE SAME

CROSS-REFERENCE TO RELATED APPLICATION

This application claims priority under 35 U.S.C. §119 to Korean Patent Application No. 10-2014-0114480 filed on Aug. 29, 2014, the disclosure of which is hereby incorporated by reference in its entirety.

BACKGROUND

1. Field

Example embodiments of relate to electrostatic discharge (ESD) protection devices having a high-resistance region and methods of forming the same.

2. Description of Related Art

Various methods are being studied for improving performance of an electrostatic discharge (ESD) protection device which prevents electric shock to internal circuits formed on a semiconductor substrate. A first impurity region and a second impurity region spaced apart from the first impurity region may be formed on a well. An isolation layer may be formed between the first impurity region and the second impurity region. The first impurity region may be connected to an input/output (I/O) pad. The second impurity region may be connected to a ground Vss. In an ESD protection device having such a configuration, reduction of a driving current due to a phenomenon in which electric fields are concentrated in an edge portion of the first impurity region is inevitable. The driving current may be reduced by a phenomenon in which current flows are concentrated in an interface between the well and the isolation layer.

SUMMARY

Example embodiments provide electrostatic discharge (ESD) protection devices having an excellent electrical characteristic.

Other example embodiments provide methods of forming the ESD protection devices having the excellent electrical characteristic.

Embodiments provide a new technique capable of balancing current paths of the ESD protection device.

According to some example embodiments, a semiconductor device is provided. The semiconductor device includes a well on a substrate. A first impurity region connected to an input/output pad is formed on the well. A second impurity region spaced apart from the first impurity region and connected to a ground (Vss) is formed on the well. A third impurity region spaced apart from the first impurity region and connected to the ground (Vss) is formed on the well. An isolation layer is formed between the first impurity region and the second impurity region. A high-resistance region, which directly contacts the first impurity region and the well and has a resistance higher than that of the first impurity region, is formed between the first impurity region and the isolation layer. The well and the third impurity region include first conductive type impurities. The first impurity region and the second impurity region include second conductive type impurities different from the first conductive type impurities.

An upper end of the high-resistance region may be formed at a level higher than a lower end of the first impurity region. A lower end of the high-resistance region may be formed at a level lower than the lower end of the first impurity region.

A lower end of the isolation layer may be formed at a level lower than the lower end of the first impurity region. The lower end of the high-resistance region may be formed at a level lower than the lower end of the isolation layer.

The high-resistance region may overlap a lower part of the isolation layer.

The high-resistance region may include the second conductive type impurities. An atomic ratio of the second conductive type impurities in the high-resistance region may be smaller than that of the second conductive type impurities in first impurity region.

A fourth impurity region may be formed between the second impurity region and the isolation layer. The second impurity region may be formed between the third impurity region and the fourth impurity region. The fourth impurity region may include the first conductive type impurities.

A lower plug may be formed on the third impurity region. A resistance pattern may be formed on the lower plug. An upper plug may be formed on the resistance pattern. The upper plug may be connected to the ground (Vss). The third impurity region may be formed between the isolation layer and the second impurity region.

The well may include a first region. A second region having a resistance lower than that of the first region may be formed on the first region. A third region having a resistance lower than that of the first region may be formed on the second region. The second region and the third region may partially overlap a lower part of the first impurity region. The first region may surround a bottom and side surfaces of the high-resistance region.

The first region may directly contact the first impurity region between the high-resistance region and the third region.

The third region may be fainted between the first impurity region and the second region. The third region may have a resistance higher than that of the second region.

An atomic ratio of the first conductive type impurities in the third region may be greater than that of the first conductive type impurities in the first region and smaller than that of the first conductive type impurities in the second region.

The well may include a fourth region formed on the first region and having a resistance lower than that of the first region. A fifth region having a resistance lower than that of the first region may be formed on the fourth region. The fourth region and the fifth region may overlap the second impurity region, the third impurity region, and the isolation layer.

The fifth region may have a resistance higher than that of the fourth region.

An atomic ratio of the first conductive type impurities in the fifth region may be greater than that of the first conductive type impurities in the first region and smaller than that of the first conductive type impurities in the fourth region.

A distance between the fourth region and the high-resistance region may be greater than a distance between the fifth region and the high-resistance region.

According to other example embodiments, a semiconductor device is provided. The semiconductor device includes a well on a substrate. A plurality of electrostatic discharge (ESD) protection devices are formed on the well. Each of the ESD protection devices includes a first impurity region connected to an input/output pad. A second impurity region spaced apart from the first impurity region and connected to a ground (Vss) is formed. A third impurity region spaced apart from the first impurity region and connected to the ground (Vss) is formed. An isolation layer is formed between the first impurity region and the second impurity region. A high-resistance region, which directly contacts the first impurity region and the well and has a resistance higher than that of the first impurity region, is formed between the first impurity region and the isolation layer. At least one of the first impurity region, the second impurity region, and the third impurity region has a hexagonal shape. The well and the third impurity region include first conductive type impurities. The first impurity region and the second impurity region include second conductive type impurities different from the first conductive type impurities.

The first impurity region may have a regular hexagonal shape. The high-resistance region may surround the first impurity region. The isolation layer may surround an outside of the high-resistance region. The second impurity region may surround an outside of the isolation layer. The third impurity region may surround an outside of the second impurity region. The ESD protection devices may have a honeycomb shape.

The third impurity region may have a regular hexagonal shape. The second impurity region may surround an outside of the third impurity region. The isolation layer may surround an outside of the second impurity region. The high-resistance region may surround an outside of the isolation layer. The first impurity region may surround an outside of the high-resistance region. The ESD protection devices may have a honeycomb shape.

According to still other example embodiments, a semiconductor device is provided. The semiconductor device includes a well on a substrate. A first impurity region connected to an input/output pad is formed on the well. A second impurity region spaced apart from the first impurity region and connected to a ground (Vss) is formed on the well. A third impurity region spaced apart from the first impurity region and connected to the ground (Vss) is formed on the well. An isolation layer is formed between the first impurity region and the second impurity region. The well and the third impurity region include first conductive type impurities. The first impurity region and the second impurity region include second conductive type impurities different from the first conductive type impurities. The well includes a first region. A second region having a resistance lower than that of the first region is formed on the first region. A third region having a resistance lower than that of the first region is formed on the second region. A fourth region having a resistance lower than that of the first region is formed on the first region. A fifth region having a resistance lower than that of the first region is formed on the fourth region. The second region and the third region partially overlap a lower part of the first impurity region. The fourth region and the fifth region overlap the second impurity region, the third impurity region, and the isolation layer. The first region between the third region and the fifth region directly contacts the isolation layer and the first impurity region.

A fourth impurity region may be formed between the first impurity region and the isolation layer. The fourth impurity region may include the first conductive type impurities.

BRIEF DESCRIPTION OF THE DRAWINGS

Example embodiments will be more clearly understood from the following detailed description taken in conjunction with the accompanying drawings.

FIG. 1 is a cross-sectional view for describing a semiconductor device and a method of forming the same according to some example embodiments;

FIG. 2 is a cross-sectional view for describing an operation of the semiconductor device according to other example embodiments;

FIG. 3 is a schematic block diagram showing a part of a semiconductor device according to still other example embodiments;

FIG. 4 is an equivalent circuit diagram showing the part of the semiconductor device according to still yet other example embodiments;

FIGS. 5 to 13 are layouts showing a part of a semiconductor device according to still yet other example embodiments;

FIGS. 14 to 21 are cross-sectional views for describing a semiconductor device and a method of forming the same according to still yet other example embodiments; and FIGS. 22 and 23 are block diagrams showing electronic systems according to further other example embodiments.

DETAILED DESCRIPTION OF EMBODIMENTS

Figure 1:
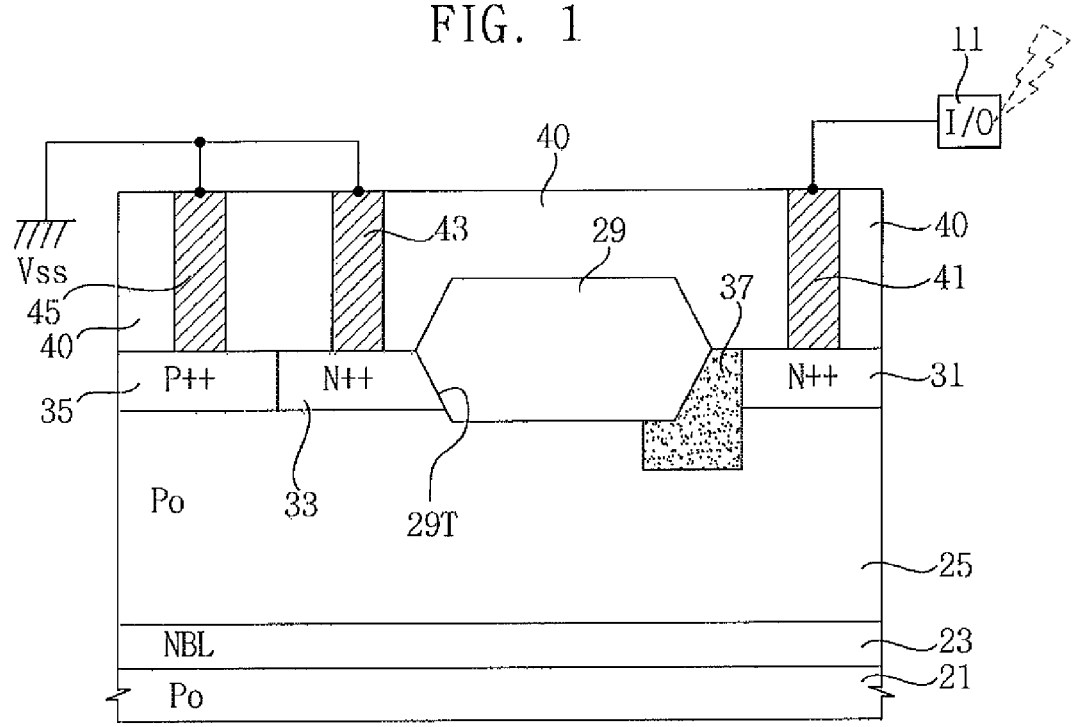
FIGS. 1-23 represent non-limiting, example embodiments as described herein.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concepts to those skilled in the art.

The terminology used herein is for the purpose of describing particular embodiments only and is not intended to be limiting of the inventive concepts. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals denote the same components throughout the specification. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

The exemplary embodiments of the inventive concepts will be described with reference to cross-sectional views and/or plan views, which are ideal exemplary views. Thicknesses of layers and areas are exaggerated for effective description of the technical contents in the drawings. Forms of the embodiments may be modified by the manufacturing technology and/or tolerance. Therefore, the embodiments of the inventive concepts are not intended to be limited to illustrated specific forms, and include modifications of forms generated according to manufacturing processes. For example, an etching area illustrated at a right angle may be round or have a predetermined curvature. Therefore, areas illustrated in the drawings have overview properties, and shapes of the areas are illustrated special forms of the areas of a device, and are not intended to be limited to the scope of the inventive concepts.

Hereinafter, like reference numerals in the drawings denote like elements. Therefore, although like reference numerals or similar reference numerals are not mentioned or described in the drawing, it will be described with reference to the other drawings. Further, although reference numerals are not illustrated, it will be described with reference to the other drawings.

Terms such as "front side," and "back side" may be used in a relative sense herein to facilitate easy understanding of the inventive concepts. Accordingly, "front side," and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa. However, "front side," and "back side" cannot be used interchangeably in the same embodiment.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

FIG. 1 is a cross-sectional view for describing a semiconductor device according to some example embodiments.

Referring to FIG. 1, a buried interconnection layer 23 may be formed on a substrate 21. A well 25 may be formed on the buried interconnection layer 23. An isolation layer 29, a first impurity region 31, a second impurity region 33, a third impurity region 35, and a high-resistance region 37 may be formed on the well 25. An interlayer insulating layer 40 may be formed on the substrate 21. A first plug 41, a second plug 43, and a third plug 45 passing through the interlayer insulating layer 40 may be formed. The first plug 41 may be electrically connected to an input/output pad 11. The second plug 43 and the third plug 45 may be connected to a ground Vss.

The well 25 and the third impurity region 35 may include first conductive type impurities. The first impurity region 31, the second impurity region 33, and the high-resistance region 37 may include second conductive type impurities. The second conductive type impurities may have a conductive type different from the first conductive type impurities. When the first conductive type is a P-type, the second conductive type may have an N-type. When the first conductive type is an N-type, the second conductive type may have a P-type. Hereinafter, a case in which the first conductive type is a P-type and the second conductive type is an N-type will be assumed and described. The P-type impurities may include B, BF, BF2, or a combination thereof. The N-type impurities may include P, As, or a combination thereof.

The isolation layer 29 may be formed between the first impurity region 31 and the third impurity region 35. The second impurity region 33 may be formed between the isolation layer 29 and the third impurity region 35. The high-resistance region 37 may be formed between the first impurity region 31 and the isolation layer 29.

The isolation layer 29 may directly contact the well 25, the second impurity region 33, and the high-resistance region 37. A lower end of the isolation layer 29 may be formed at a level lower than an upper end of the well 25. The lower end of the isolation layer 29 may be formed at a level lower than a lower end of the first impurity region 31. The lower end of the isolation layer 29 may be formed at a level lower than a lower end of the second impurity region 33. The lower end of the isolation layer 29 may be formed at a level lower than a lower end of the third impurity region 35.

The first impurity region 31 may directly contact the well 25 and the high-resistance region 37. The lower end of the first impurity region 31 may be formed at a level higher than the lower end of the isolation layer 29. The lower end of the first impurity region 31 may be formed at a level higher than a lower end of the high-resistance region 37. The first impurity region 31 may have a resistance lower than the high-resistance region 37. An atomic ratio of the second conductive type impurities in the first impurity region 31 may be greater than that of the second conductive type impurities in the high-resistance region 37.

The high-resistance region 37 may directly contact the first impurity region 31, the well 25, and the isolation layer 29. The high-resistance region 37 may overlap a lower part of the isolation layer 29. The lower end of the high-resistance region 37 may be formed at a level lower than the lower end of the isolation layer 29. An upper end of the high-resistance region 37 may be formed at the same level as an upper end of the first impurity region 31. The lower end of the high-resistance region 37 may be formed at a level lower than the lower end of the first impurity region 31. The well 25 may be maintained between the lower end of the high-resistance region 37 and the buried interconnection layer 23. The high-resistance region 37 may have a resistance higher than the first impurity region 31. An atomic ratio of the second conductive type impurities in the high-resistance region 37 may be smaller than that of the second conductive type impurities in the first impurity region 31. The high-resistance region 37 may be referred to as a low-doping region.

The second impurity region 33 may directly contact the third impurity region 35, the well 25, and the isolation layer 29. The lower end of the second impurity region 33 may be formed at a level higher than the lower end of the isolation layer 29. The second impurity region 33 may have a resistance lower than the high-resistance region 37. An atomic ratio of the second conductive type impurities in the second impurity region 33 may be greater than that of the second conductive type impurities in the high-resistance region 37.

The third impurity region 35 may directly contact the second impurity region 33 and the well 25. The lower end of the third impurity region 35 may be formed at a level higher than the lower end of the isolation layer 29. The third impurity region 35 may have a resistance lower than the well 25. An atomic ratio of the first conductive type impurities in the third impurity region 35 may be greater than that of the first conductive type impurities in the well 25.

The first plug 41 may directly contact the first impurity region 31. The second plug 43 may directly contact the second impurity region 33. The third plug 45 may directly contact the third impurity region 35.

The buried interconnection layer 23 may be connected to a power Vdd or may be floating. The buried interconnection layer 23 may be omitted.

Figure 2:
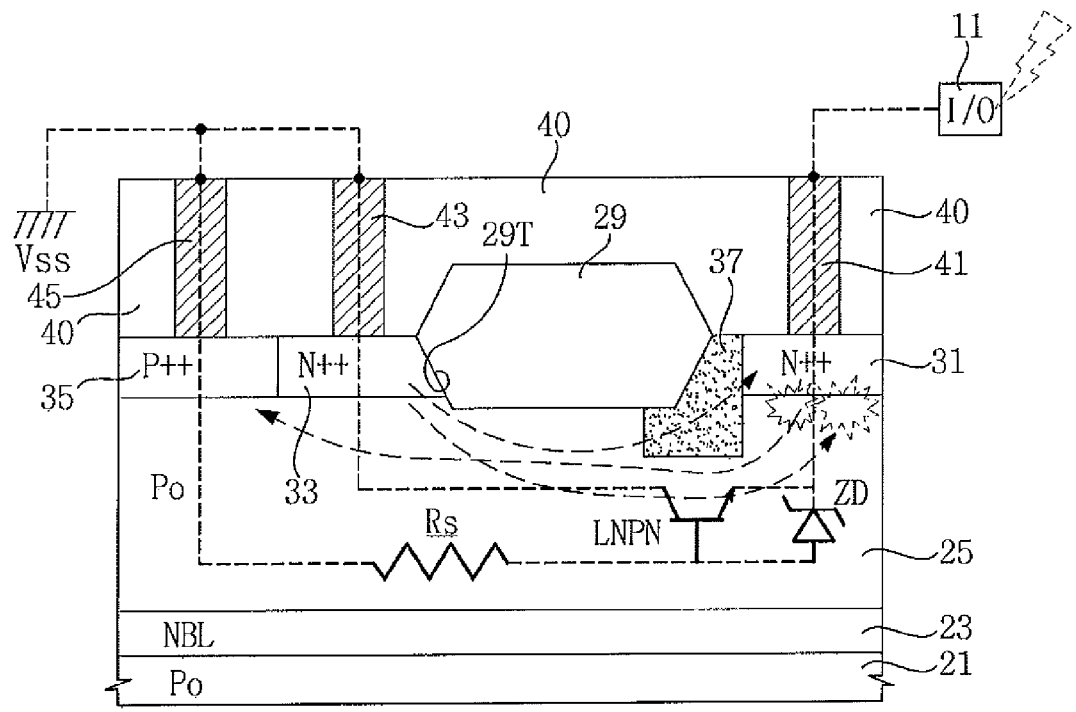

FIG. 2 is a cross-sectional view for describing an operation of the semiconductor device according to other example embodiments.

Referring to FIG. 2, the first impurity region 31, the well 25, and the second impurity region 33 may be interpreted as a bipolar transistor. For example, the first impurity region 31, the well 25, and the second impurity region 33 may be interpreted as a bipolar transistor having a lateral NPN (LNPN) structure. The first impurity region 31, the well 25, and the third impurity region 35 may be interpreted as a diode or a resistance (Rs). For example, the first impurity region 31 and the well 25 may be interpreted as a Zener diode (ZD). The well 25 may be interpreted as the resistance (Rs). The first impurity region 31, the high-resistance region 37, the well 25, and the second impurity region 33 may be configured as an electrostatic discharge (ESD) protection device.

The high-resistance region 37 may serve to prevent a phenomenon in which electric fields are concentrated in an edge part of the first impurity region 31. Current paths between the first impurity region 31 and the well 25 may be substantially balanced due to an arrangement of the high-resistance region 37 compared to a conventional method. Current drivability of the ESD protection device according to example embodiments may be substantially improved compared to the conventional method.

Figure 3:
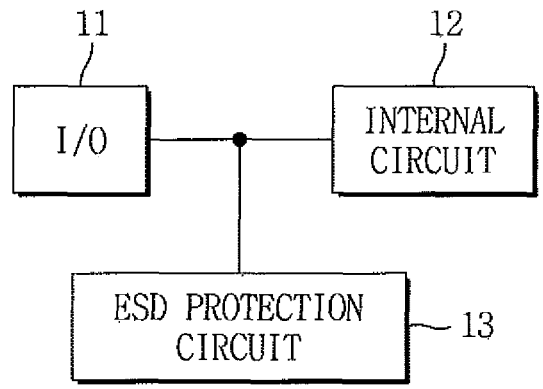

FIG. 3 is a schematic block diagram showing a part of a semiconductor device according to still other example embodiments.

Referring to FIG. 3, an ESD protection device 13 may be connected between an input/output (110) pad 11 and an internal circuit 12. Data may be input to or output from the internal circuit 12 through the I/O pad 11. When an abnormal signal such as an electrostatic discharge is input through the I/O pad 11, the ESD protection device 13 may serve to prevent damage to the internal circuit 12.

Figure 4:
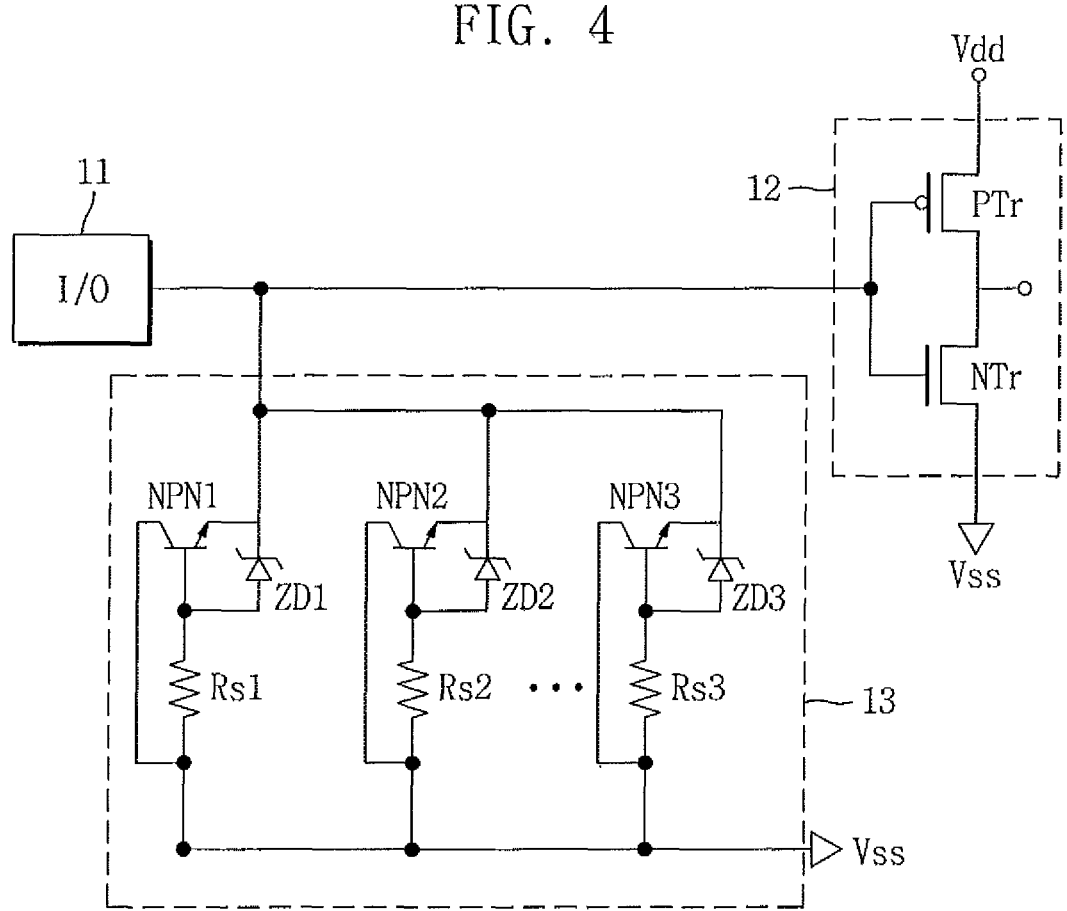

FIG. 4 is an equivalent circuit diagram showing the part of the semiconductor device according to still yet example embodiments.

Referring to FIG. 4, the ESD protection device 13 may include a plurality of NPN transistors NPN1, NPN2, and NPN3, a plurality of Zener diodes ZD1, ZD2, and ZD3, and a plurality of resistances Rs1, Rs2, and Rs3. Ends of the NPN transistors NPN1, NPN2, and NPN3 and the Zener diodes ZD1, ZD2, and ZD3 may be connected to the I/O pad 11. The NPN transistors NPN1, NPN2, and NPN3 and the Zener diodes ZD1, ZD2, and ZD3 may be connected to a ground Vss. The ESD protection device 13 may include a first ESD protection device NPN1, ZD1, and Rs1, a second ESD protection device NPN2, ZD2, and Rs2, and a third ESD protection device NPN3, ZD3, and Rs3. A plurality of other ESD protection devices may be formed between the second ESD protection device NPN2, ZD2, and Rs2 and the third ESD protection device NPN3, ZD3, and Rs3.

The internal circuit 12 may include a plurality of active/passive devices such as an NMOS transistor NTr and a PMOS transistor PTr. For example, gates of the NMOS transistor NTr and the PMOS transistor PTr may be connected to the I/O pad 11. A drain of the PMOS transistor PTr may be connected to a power Vdd, and a source of the PMOS transistor PTr may be connected to a drain of the NMOS transistor NTr. A source of the NMOS transistor NTr may be connected to the ground Vss.

The I/O pad 11 may be connected to the drain of the PMOS transistor PTr or the drain of the NMOS transistor NTr.

FIGS. 5 to 13 are layouts showing a part of a semiconductor device according to still yet example embodiments.

Figure 5:
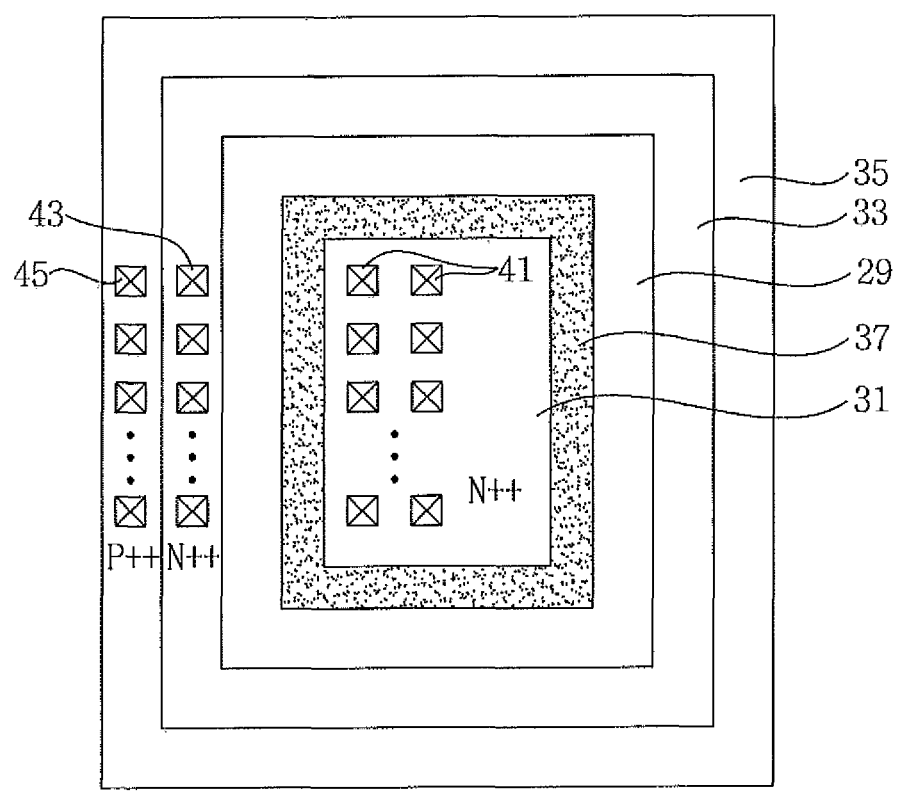

Referring to FIGS. 1 and 5, an isolation layer 29, a first impurity region 31, a second impurity region 33, a third impurity region 35, and a high-resistance region 37 may be formed on the well 25. The first impurity region 31 may be rectangular. The high-resistance region 37 may surround the first impurity region 31. The high-resistance region 37 may surround four surfaces of the first impurity region 31. The isolation layer 29 may be formed so as to surround an outside of the high-resistance region 37. The second impurity region 33 may be formed so as to surround an outside of the isolation layer 29. The third impurity region 35 may be formed so as to surround an outside of the second impurity region 33. First plugs 41 may be formed on the first impurity region 31. Second plugs 43 may be formed on the second impurity region 33. Third plugs 45 may be formed on the third impurity region 35.

The second impurity region 33 may be spaced apart from the first impurity region 31. Outside surfaces of the high-resistance region 37, the isolation layer 29, the second impurity region 33, and the third impurity region 35 each may be rectangular.

Figure 6:
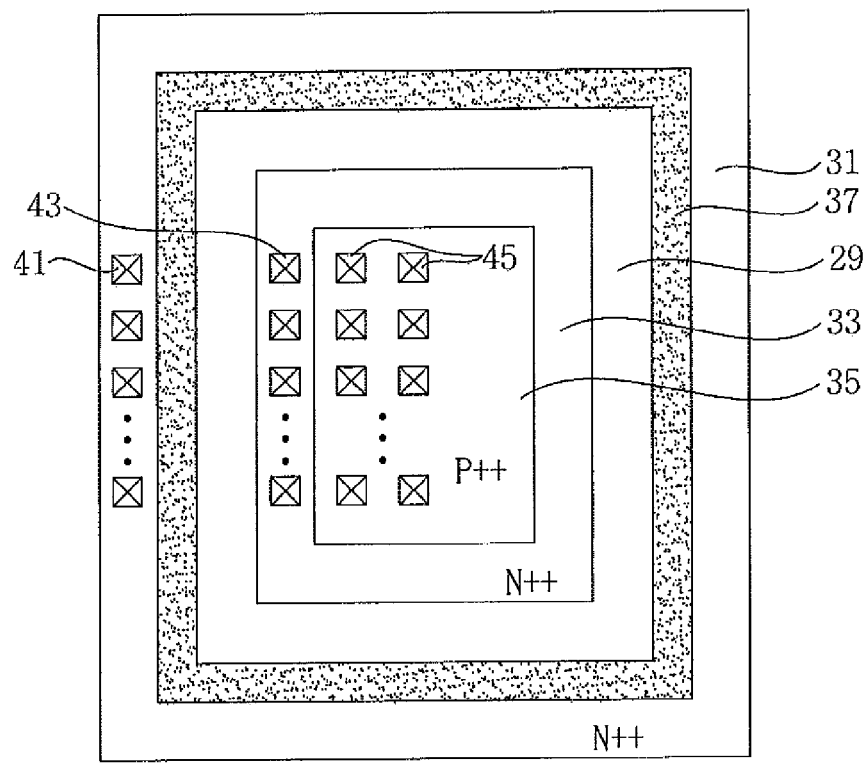

Referring to FIGS. 1 and 6, a third impurity region 35 may be rectangular. A second impurity region 33 may be formed so as to surround an outside of the third impurity region 35. An isolation layer 29 may be formed so as to surround an outside of the second impurity region 33. A high-resistance region 37 may be formed so as to surround an outside of the isolation layer 29. A first impurity region 31 may be formed so as to surround an outside of the high-resistance region 37. Outside surfaces of the second impurity region 33, the isolation layer 29, the high-resistance region 37, and the first impurity region 31 each may be rectangular.

Figure 7:
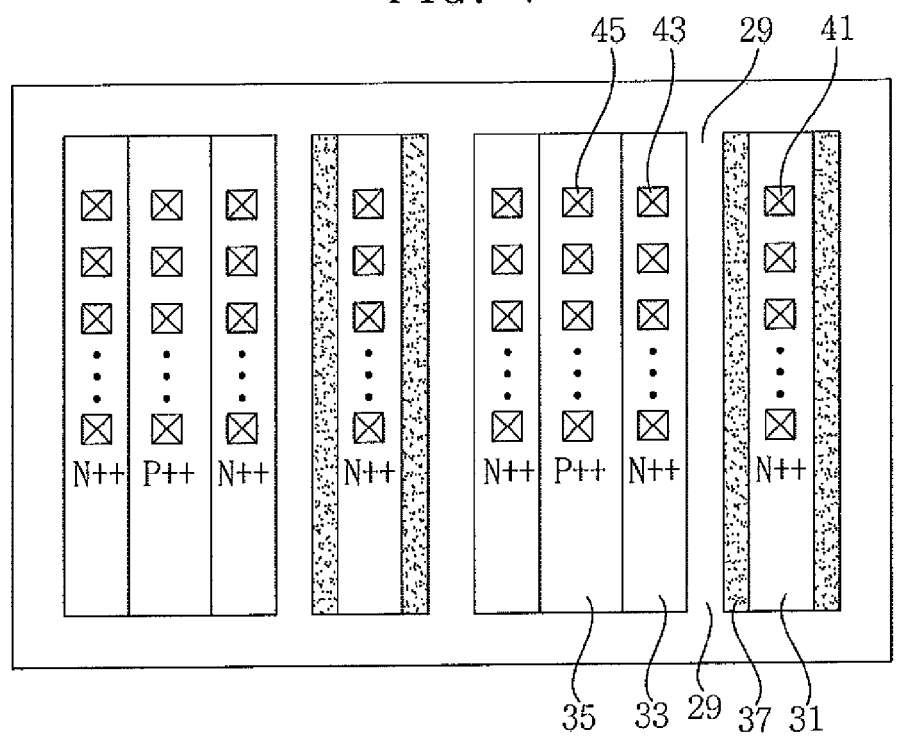

Referring to FIGS. 1 and 7, a first impurity region 31 may have a bar shape. A high-resistance region 37 may be formed on both sides of the first impurity region 31. An isolation layer 29 may be formed so as to surround an outside of the first impurity region 31 and the high-resistance region 37. The isolation layer 29 may be formed on an outside of a second impurity region 33. A third impurity region 35 may be formed on an outside of the second impurity region 33. The isolation layer 29 may surround an outside of the second impurity region 33 and the third impurity region 35.

The first impurity region 31, the high-resistance region 37, the second impurity region 33, and the third impurity region 35 may be parallel. A plurality of the first impurity region 31, the high-resistance region 37, the isolation layer 29, the second impurity region 33, and the third impurity region 35 may be repeatedly formed on the well 25.

Figure 8:
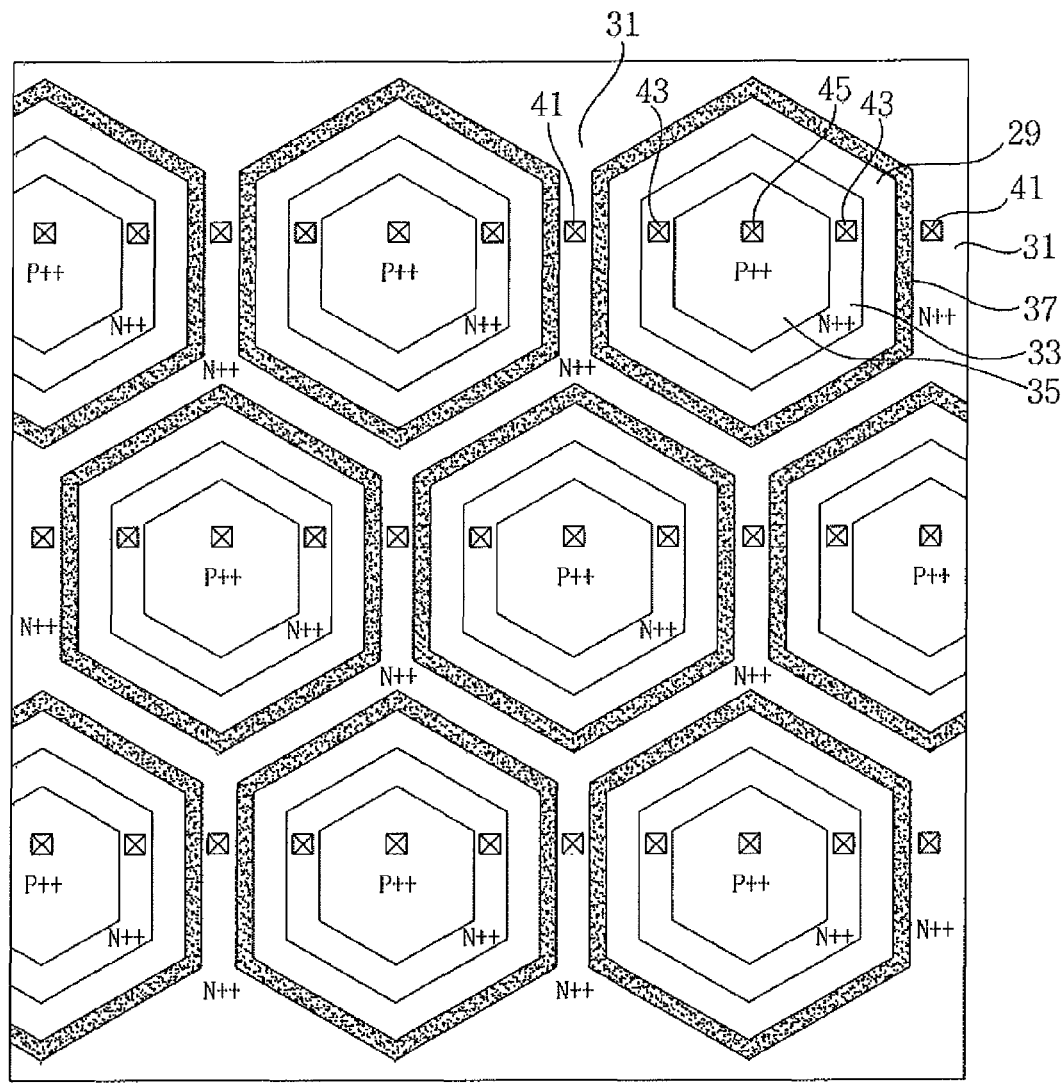

Referring to FIGS. 1 and 8, a third impurity region 35 may have a regular hexagonal shape. A second impurity region 33 may be formed so as to surround an outside of the third impurity region 35. An isolation layer 29 may be formed so as to surround an outside of the second impurity region 33. A high-resistance region 37 may be formed so as to surround an outside of the isolation layer 29. A first impurity region 31 may be formed so as to surround an outside of the high-resistance region 37. Outside surfaces of the second impurity region 33, the isolation layer 29, and the high-resistance region 37 each may have a regular hexagonal shape. The well 25, the third impurity region 35, the second impurity region 33, the isolation layer 29, the high-resistance region 37, and the first impurity region 31 may be configured as an ESD protection device.

A plurality of the third impurity region 35, the second impurity region 33, the isolation layer 29, the high-resistance region 37, and the first impurity region 31 may be repeatedly formed on the well 25. A repeated structure of the third impurity region 35, the second impurity region 33, the isolation layer 29, the high-resistance region 37, and the first impurity region 31 may have a honeycomb shape.

Figure 9:
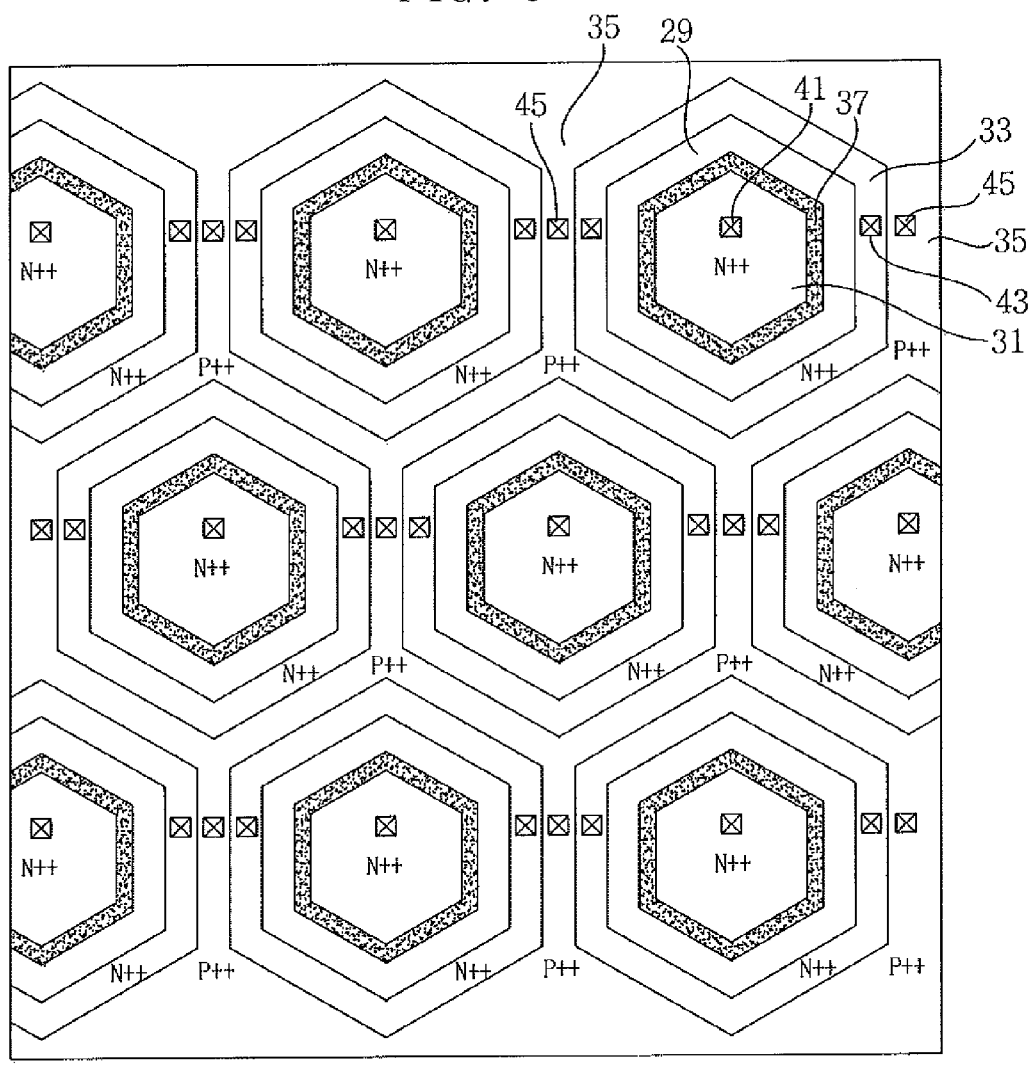

Referring to FIGS. 1 and 9, an isolation layer 29, a first impurity region 31, a second impurity region 33, a third impurity region 35, and a high-resistance region 37 may be formed on the well 25. The first impurity region 31 may have a regular hexagonal shape. The high-resistance region 37 may surround the first impurity region 31. The isolation layer 29 may surround an outside of the high-resistance region 37. The second impurity region 33 may surround an outside of the isolation layer 29. The third impurity region 35 may surround an outside of the second impurity region 33. Outside surfaces of the high-resistance region 37, the isolation layer 29, and the second impurity region 33 each may have a regular hexagonal shape. A repeated structure of the first impurity region 31, the high-resistance region 37, the isolation layer 29, the second impurity region 33, and the third impurity region 35 may have a honeycomb shape.

Figure 10:
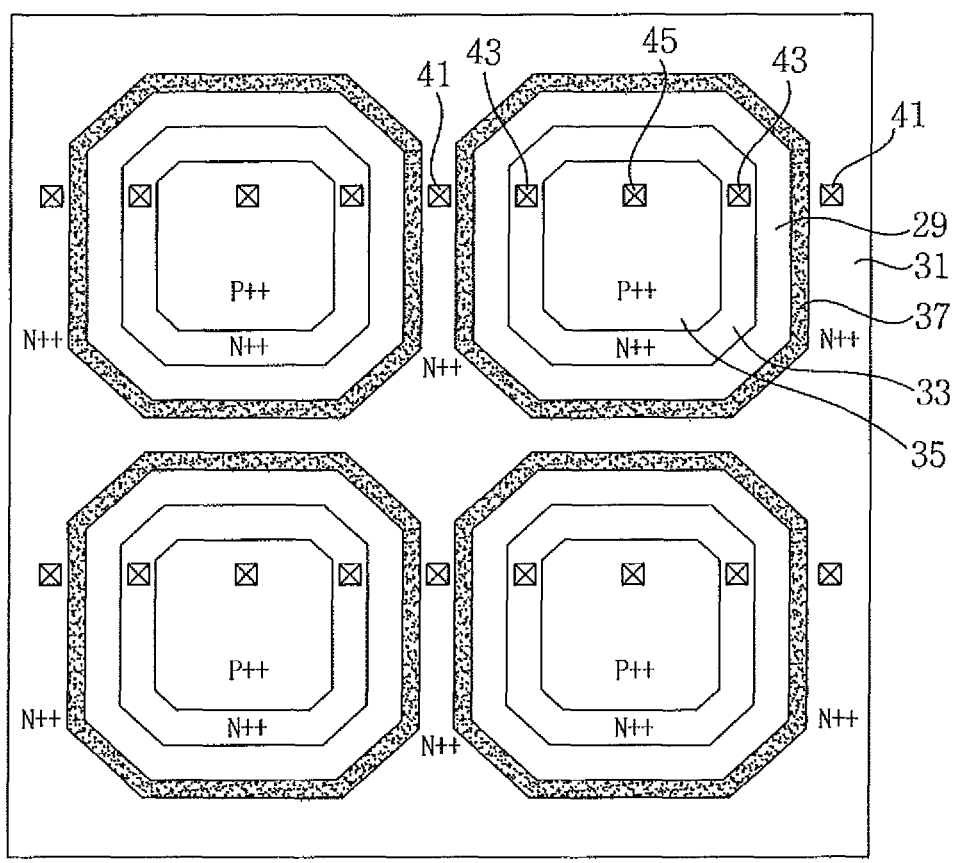

Referring to FIGS. 1 and 10, a third impurity region 35 may have an octagonal shape. A second impurity region 33 may be formed so as to surround an outside of the third impurity region 35. An isolation layer 29 may be formed so as to surround an outside of the second impurity region 33. A high-resistance region 37 may be formed so as to surround an outside of the isolation layer 29. A first impurity region 31 may be formed so as to surround an outside of the high-resistance region 37. Outside surfaces of the second impurity region 33, the isolation layer 29, and the high-resistance region 37 each may have an octagonal shape. The well 25, the third impurity region 35, the second impurity region 33, the isolation layer 29, the high-resistance region 37, and the first impurity region 31 may be configured as an ESD protection device. A plurality of the third impurity region 35, the second impurity region 33, the isolation layer 29, the high-resistance region 37, and the first impurity region 31 may be repeatedly formed on the well 25.

Figure 11:
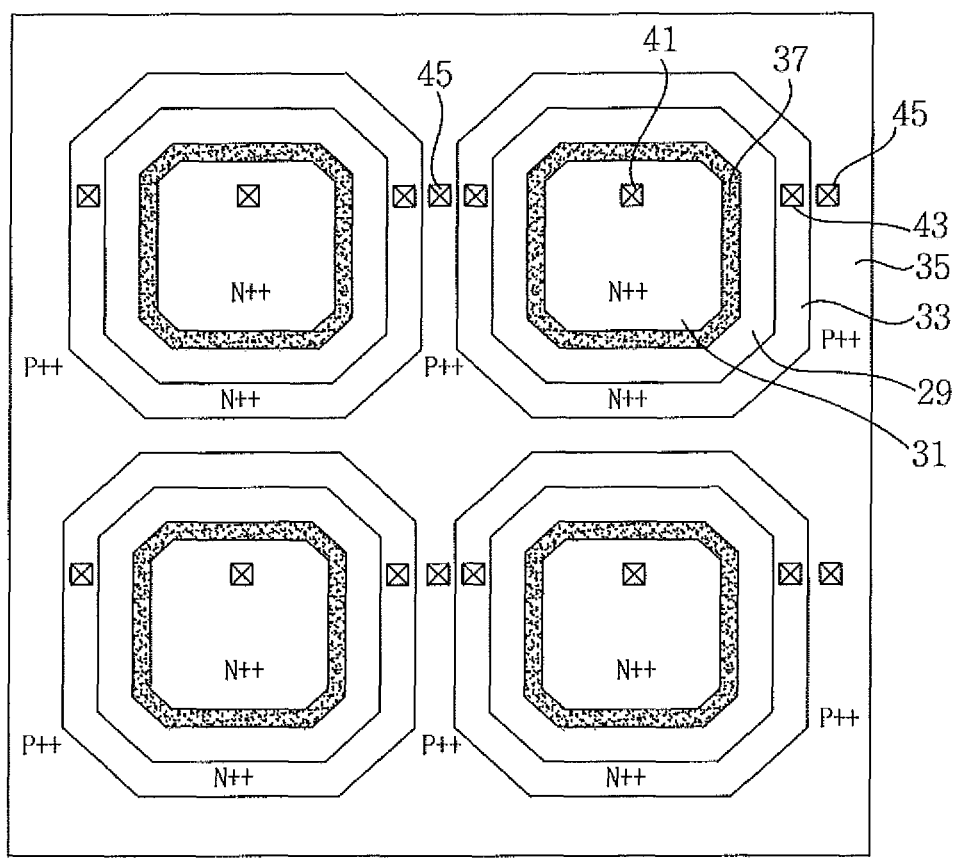

Referring to FIGS. 1 and 11, an isolation layer 29, a first impurity region 31, a second impurity region 33, a third impurity region 35, and a high-resistance region 37 may be formed on the well 25. The first impurity region 31 may have an octagonal shape. The high-resistance region 37 may surround the first impurity region 31. The isolation layer 29 may surround an outside of the high-resistance region 37. The second impurity region 33 may surround an outside of the isolation layer 29. The third impurity region 35 may surround an outside of the second impurity region 33. Outside surfaces of the high-resistance region 37, the isolation layer 29, and the second impurity region 33 each may have an octagonal shape.

Figure 12:
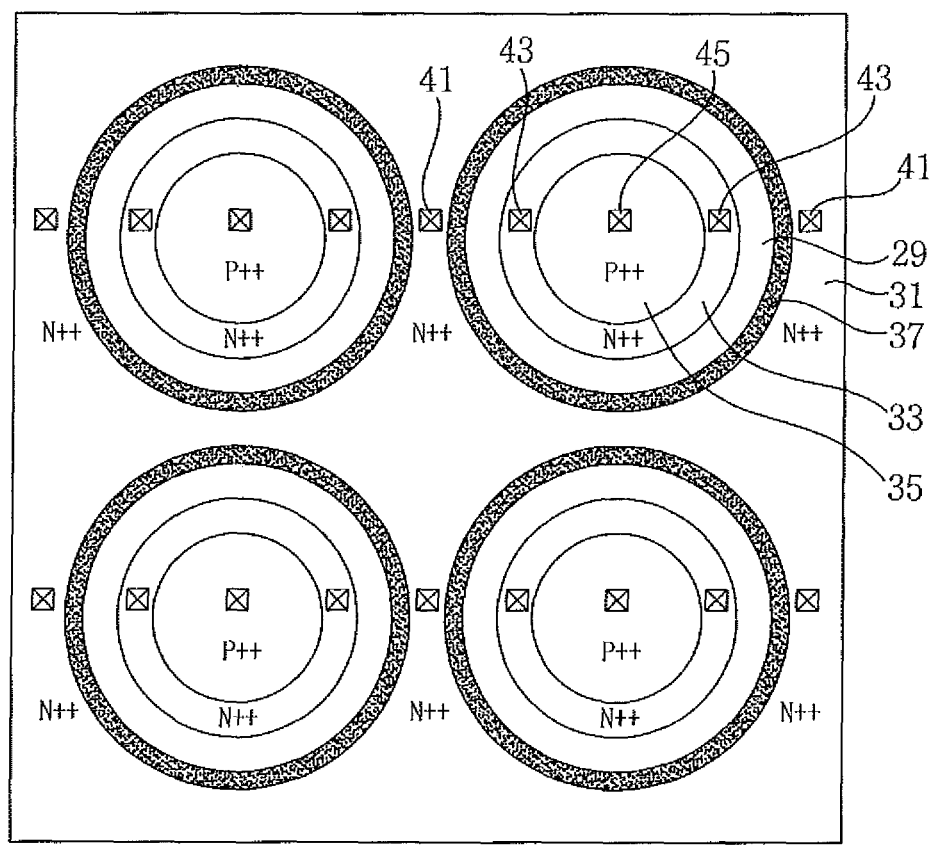

Referring to FIGS. 1 and 12, a third impurity region 35 may have a circular shape. A second impurity region 33 may be formed so as to surround an outside of the third impurity region 35. An isolation layer 29 may be formed so as to surround an outside of the second impurity region 33. A high-resistance region 37 may be formed so as to surround an outside of the isolation layer 29. A first impurity region 31 may be formed so as to surround an outside of the high-resistance region 37. Outside surfaces of the second impurity region 33, the isolation layer 29, and the high-resistance region 37 each may have a circular shape. The well 25, the third impurity region 35, the second impurity region 33, the isolation layer 29, the high-resistance region 37, and the first impurity region 31 may be configured as an ESD protection device. A plurality of the third impurity region 35, the second impurity region 33, the isolation layer 29, the high-resistance region 37, and the first impurity region 31 may be repeatedly formed on the well 25.

Figure 13:
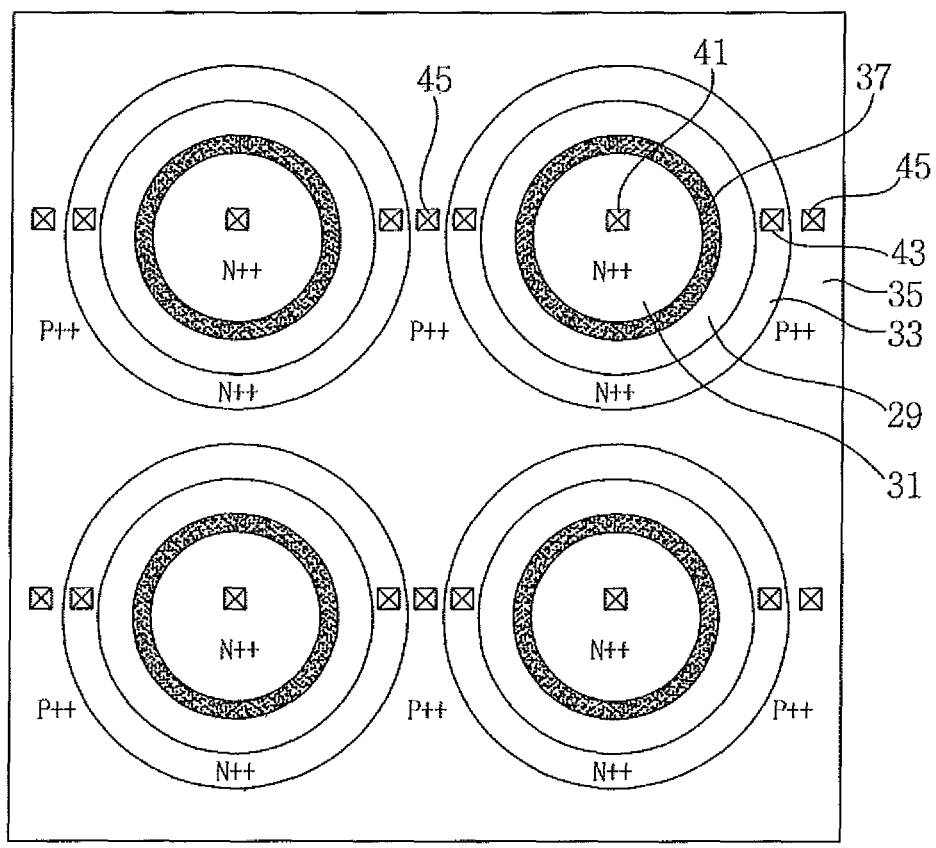

Referring to FIGS. 1 and 13, an isolation layer 29, a first impurity region 31, a second impurity region 33, a third impurity region 35, and a high-resistance region 37 may be formed on the well 25. The first impurity region 31 may have a circular shape. The high-resistance region 37 may surround the first impurity region 31. The isolation layer 29 may surround an outside of the high-resistance region 37. The second impurity region 33 may surround an outside of the isolation layer 29. The third impurity region 35 may surround an outside of the second impurity region 33. Outside surfaces of the high-resistance region 37, the isolation layer 29, and the second impurity region 33 each may have a circular shape.

FIGS. 14 to 21 are cross-sectional views for describing a semiconductor device and a method of forming the same according to still yet example embodiments.

Figure 14:
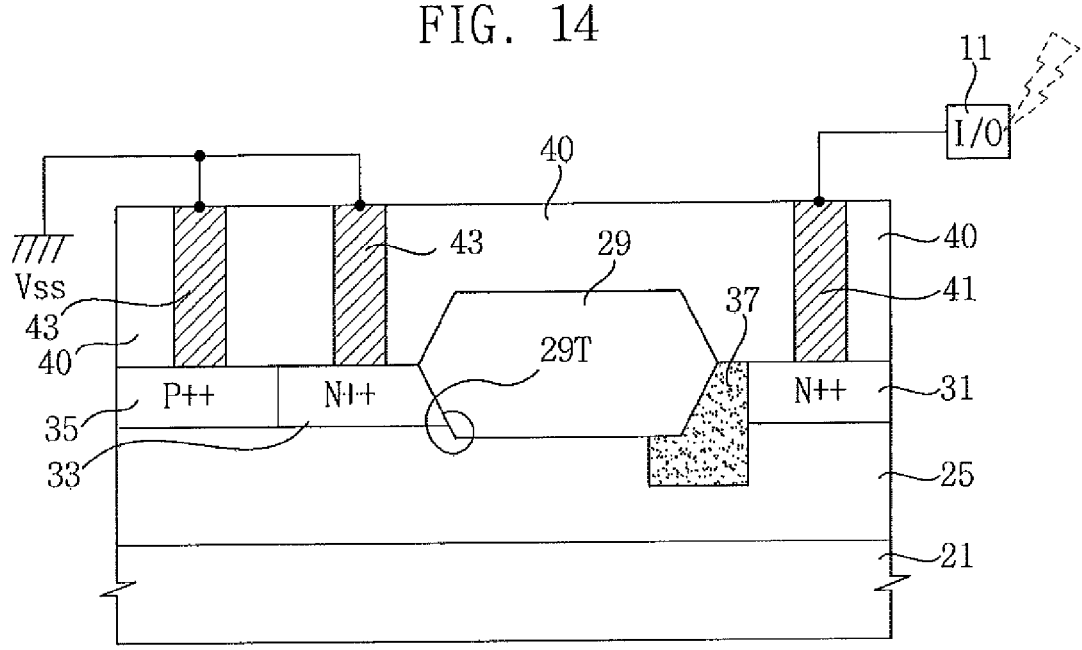

Referring to FIG. 14, a well 25 may be formed on a substrate 21. The well region 25 may directly contact the substrate 21.

The well 25 may be omitted. An isolation layer 29, a first impurity region 31, a second impurity region 33, a third impurity region 35, and a high-resistance region 37 may be formed on the substrate 21.

Figure 15:
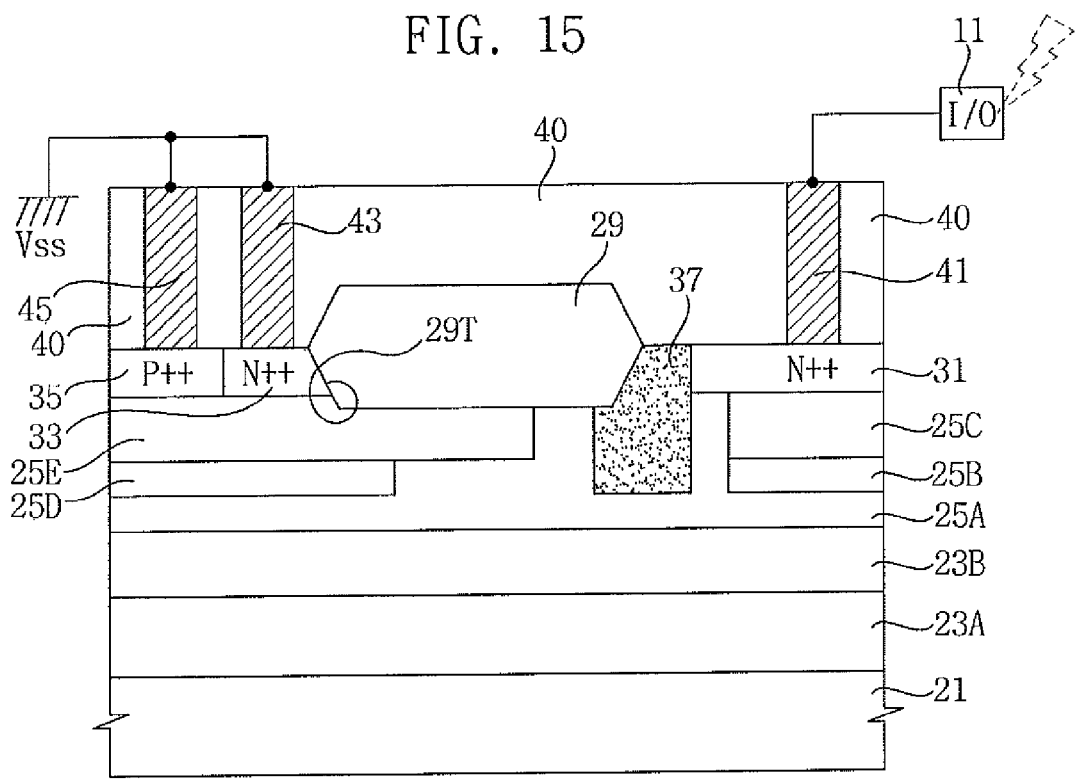

Referring to FIG. 15, a first buried interconnection layer 23A and a second buried interconnection layer 23B may be sequentially stacked on a substrate 21. Wells 25A, 25B, 25C, 25D, and 25E may be formed on the second buried interconnection layer 23B. The wells 25A, 25B, 25C, 25D, and 25E may include a first region 25A, a second region 25B, a third region 25C, a fourth region 25D, and a fifth region 25E, An isolation layer 29, a first impurity region 31, a second impurity region 33, a third impurity region 35, and a high-resistance region 37 may be formed on the wells 25A, 25B, 25C, 25D, and 25E.

The first region 25A may have a resistance higher than the second region 25B, the third region 25C, the fourth region 25D, and the fifth region 25E. An atomic ratio of first conductive type impurities in the first region 25A may be smaller than those of the first conductive type impurities in the second region 25B, the third region 25C, the fourth region 25D, and the fifth region 25E.

The second region 25B and the fourth region 25D each may have a resistance lower than the first region 25A, the third region 25C, and the fifth region 25E. Atomic ratios of the first conductive type impurities in the second region 25B and the fourth region 25D each may be greater than those of the first conductive type impurities in the first region 25A, the third region 25C, and the fifth region 25E.

The third region 25C and the fifth region 25E each may have a resistance lower than the first region 25A, and higher than the second region 25B and the fourth region 25D. The atomic ratios of the first conductive type impurities in the third region 25C and the fifth region 25E each may be smaller than those of the first conductive type impurities in the second region 25B and the fourth region 25D.

The second region 25B, the third region 25C, the fourth region 25D, and the fifth region 25E may be formed on the first region 25A. The first region 25A may surround a bottom and side surfaces of the high-resistance region 37. The second region 25B and the third region 25C may partially overlap a lower part of the first impurity region 31. The second region 25B and the third region 25C may be spaced apart from the high-resistance region 37. The second region 25B may be formed between the first region 25A and the third region 25C. The third region 25C may be formed between the first impurity region 31 and the second region 25B. The second region 25B and the third region 25C each may have a width smaller than the first impurity region 31. The first region 25A may be formed between the high-resistance region 37 and the second region 25B and between the high-resistance region 37 and the third region 25C. The first region 25A between the high-resistance region 37 and the third region 25C may directly contact the first impurity region 31. A bottom of the second region 25B may be formed at substantially the same level as a bottom of the high-resistance region 37.

The fifth region 25E may be formed on the fourth region 25D. The fourth region 25D and the fifth region 25E may overlap the second impurity region 33 and the third impurity region 35. The fourth region 25D and the fifth region 25E may extend to partially overlap the isolation layer 29. The fifth region 25E may have a width greater than the fourth region 25D. An overlap length of the fifth region 25E and the isolation layer 29 may be greater than an overlap length of the fourth region 25D and the isolation layer 29. The fourth region 25D and the fifth region 25E may be spaced apart from the high-resistance region 37. A distance between the fourth region 25D and the high-resistance region 37 may be greater than a distance between the fifth region 25E and the high-resistance region 37. The first region 25A may be formed between the fourth region 25D and the high-resistance region 37 and between the fifth region 25E and the high-resistance region 37. The first region 25A between the fifth region 25E and the high-resistance region 37 may directly contact the isolation layer 29. A bottom of the fourth region 25D may be formed at substantially the same level as the bottom of the high-resistance region 37. The fifth region 25E may directly contact the second impurity region 33, the third impurity region 35, and the isolation layer 29.

The third region 25C may have a resistance lower than the second region 25B. An atomic ratio of the first conductive type impurities in the third region 25C may be greater than that of the first conductive type impurities in the second region 25B. The fifth region 25E may have a resistance lower than the fourth region 25D. An atomic ratio of the first conductive type impurities in the fifth region 25E may be greater than that of the first conductive type impurities in the fourth region 25D.

Figure 16:
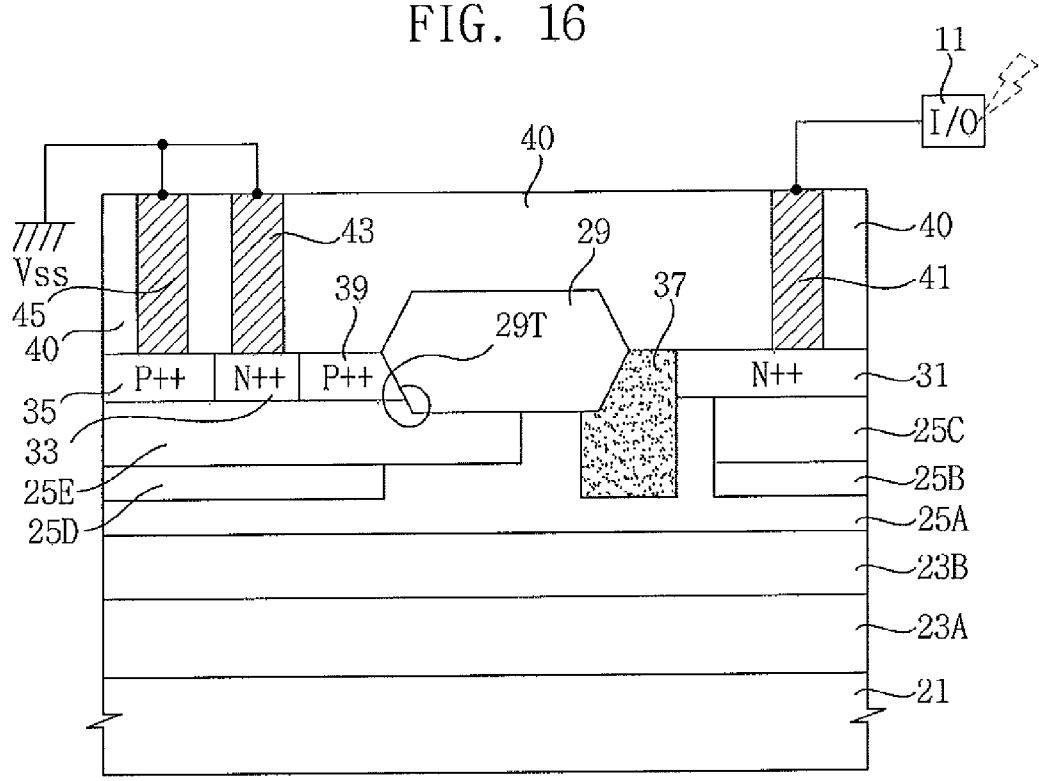

Referring to FIG. 16, an isolation layer 29, a first impurity region 31, a second impurity region 33, a third impurity region 35, a high-resistance region 37, and a fourth impurity region 39 may be formed on wells 25A, 25B, 25C, 25D, and 25E.

The fourth impurity region 39 may be formed between the isolation layer 29 and the second impurity region 33. The fourth impurity region 39 may overlap the fifth region 25E. The fourth impurity region 39 may include first conductive type impurities. The fourth impurity region 39 may have a resistance lower than the fifth region 25E. An atomic ratio of the first conductive type impurities in the fourth impurity region 39 may be greater than that of the first conductive type impurities in the fifth region 25E.

Figure 17:
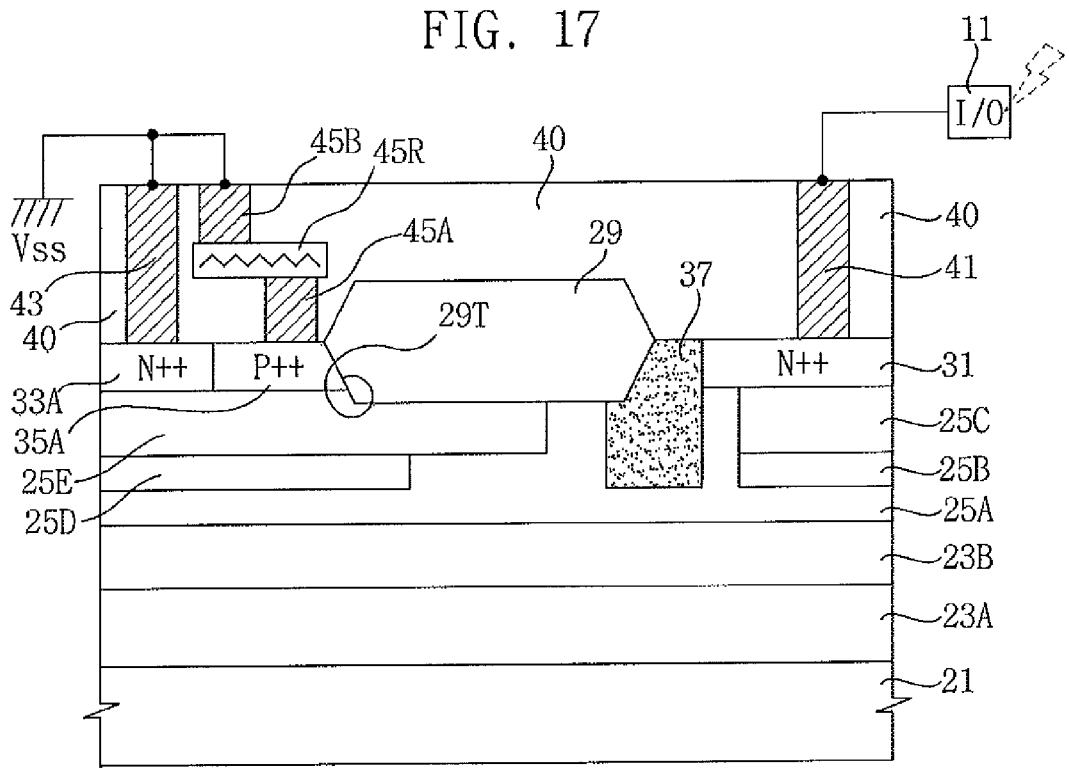

Referring to FIG. 17, an isolation layer 29, a first impurity region 31, a second impurity region 33A, a third impurity region 35A, and a high-resistance region 37 may be formed on wells 25A, 25B, 25C, 25D, and 25E. A third lower plug 45A, a resistance pattern 45R, and a third upper plug 45B may be formed in an interlayer insulating layer 40.

The third impurity region 35A may be formed between the second impurity region 33A and the isolation layer 29. The resistance pattern 45R may be formed between the third lower plug 45A and the third upper plug 45B.

Figure 18:
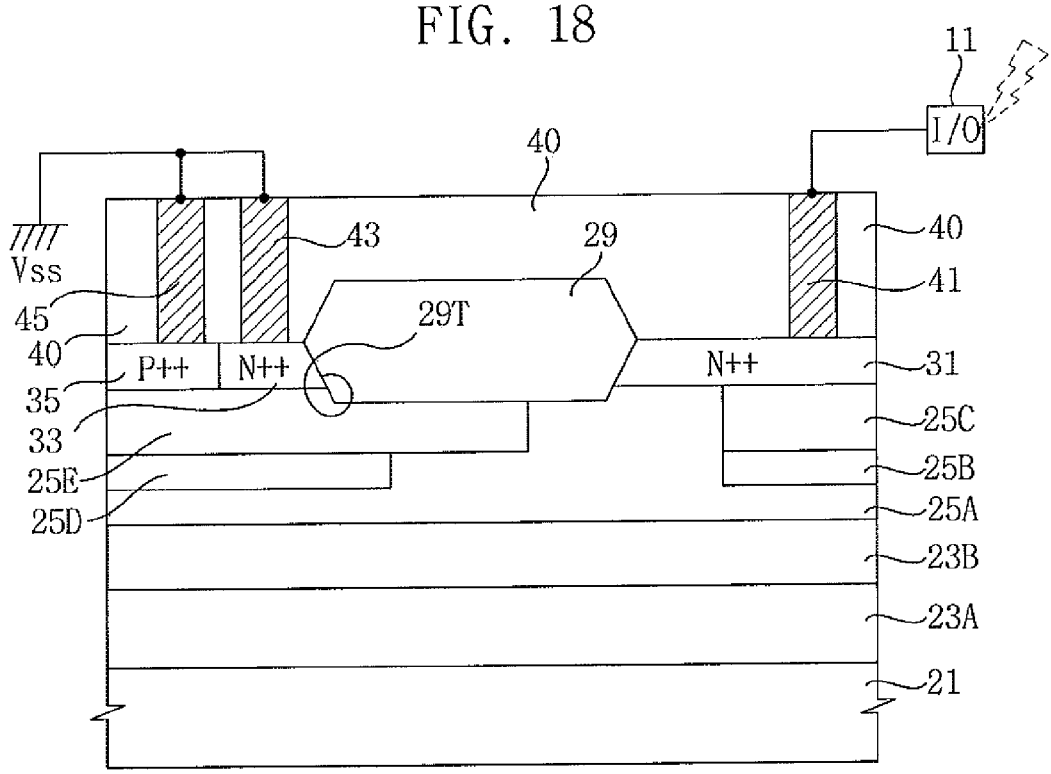

Referring to FIG. 18, an isolation layer 29, a first impurity region 31, a second impurity region 33, and a third impurity region 35 may be formed on wells 25A, 25B, 25C, 25D, and 25E. The first impurity region 31 may directly contact the isolation layer 29. The first region 25A between the third region 25C and the fifth region 25E may directly contact the first impurity region 31 and the isolation layer 29. A distance between the third region 25C and the fifth region 25E may be smaller than a distance between the second region 25B and the fourth region 25D.

Figure 19:
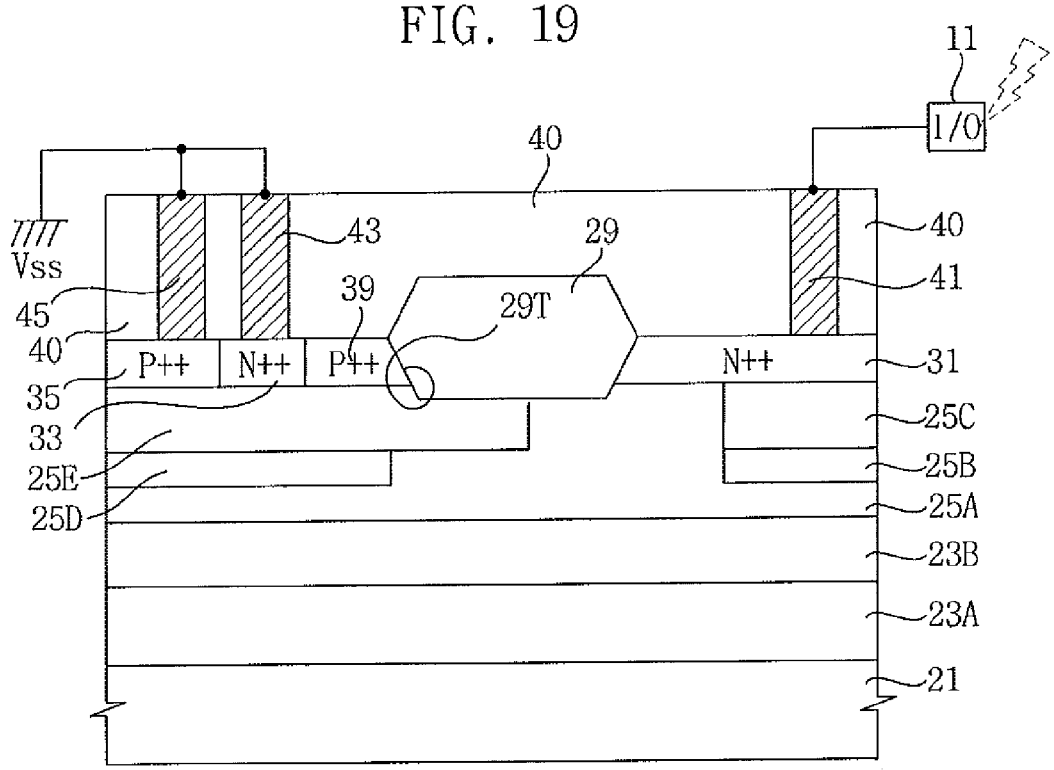

Referring to FIG. 19, an isolation layer 29, a first impurity region 31, a second impurity region 33, a third impurity region 35, and a fourth impurity region 39 may be formed on wells 25A, 25B, 25C, 25D, and 25E. The first impurity region 31 may directly contact the isolation layer 29. The first region 25A between the third region 25C and the fifth region 25E may directly contact the first impurity region 31 and the isolation layer 29. The fourth impurity region 39 may be formed between the isolation layer 29 and the second impurity region 33. The fourth impurity region 39 may overlap the fifth region 25E.

Figure 20:
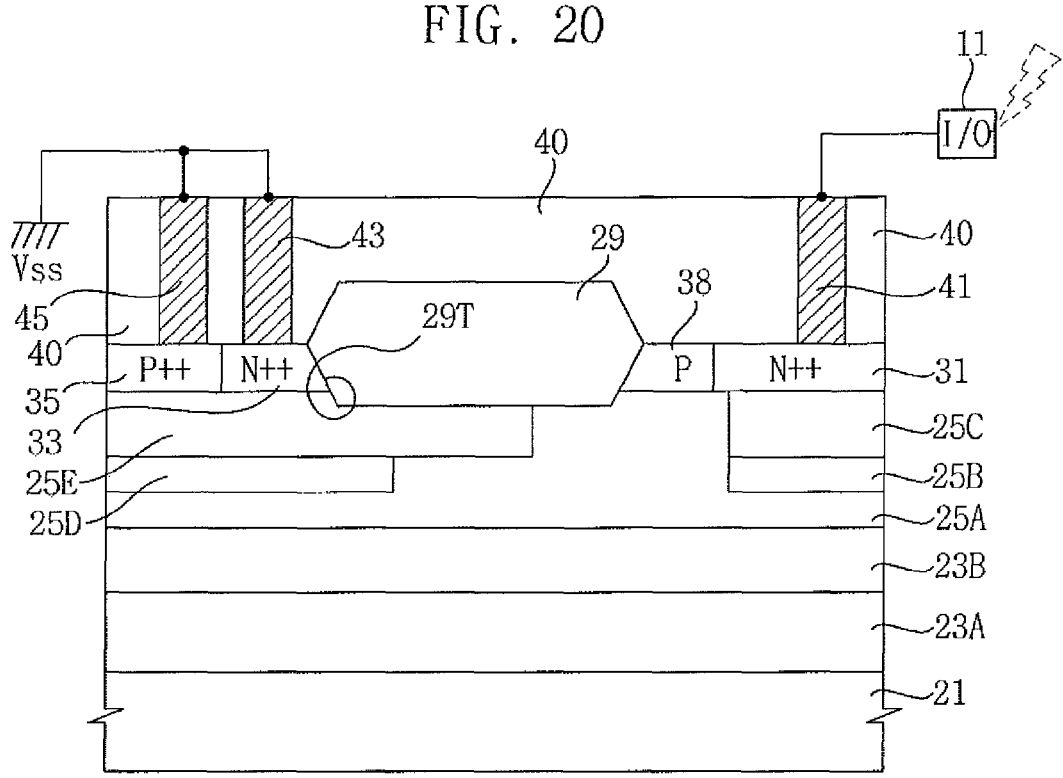

Referring to FIG. 20, an isolation layer 29, a first impurity region 31, a second impurity region 33, a third impurity region 35, and a fifth impurity region 38 may be formed on wells 25A, 25B, 25C, 25D, and 25E. The fifth impurity region 38 may be formed between the isolation layer 29 and the first impurity region 31. A lower end of the fifth impurity region 38 may be formed at a level higher than a lower end of the isolation layer 29. The fifth impurity region 38 may include first conductive type impurities. The first region 25A between the third region 25C and the fifth region 25E may directly contact the first impurity region 31, the fifth impurity region 38, and the isolation layer 29.

Figure 21:
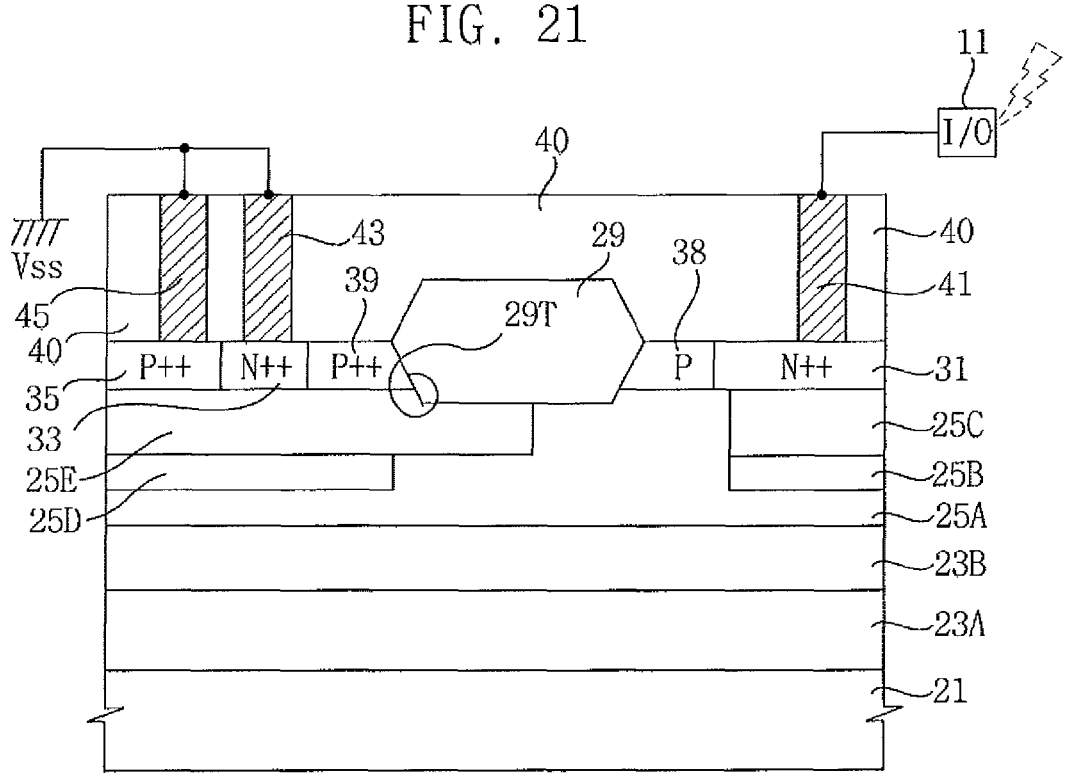

Referring to FIG. 21, an isolation layer 29, a first impurity region 31, a second impurity region 33, a third impurity region 35, a fourth impurity region 39, and a fifth impurity region 38 may be formed on wells 25A, 25B, 25C, 25D, and 25E.

Methods of forming the semiconductor according to example embodiments will be described with reference again to FIGS. 1 and 15.

Referring to FIG. 1, a buried interconnection layer 23 may be formed on a substrate 21. The substrate 21 may have a semiconductor substrate such as a silicon wafer. For example, the substrate 21 may have a single crystal silicon wafer including P-type impurities. The buried interconnection layer 23 may include a metal, a metal silicide, a metal nitride, conductive carbon, a doped semiconductor, or a combination thereof. For example, the buried interconnection layer 23 may include single crystal silicon including N-type impurities. The buried interconnection layer 23 may be formed using an ion implanting method, an epitaxial growth method, a conductive thin layer forming method, or a combination thereof.

A well 25 may be formed on the buried interconnection layer 23. The well 25 may have a semiconductor such as single crystal silicon including first conductive type impurities. An isolation layer 29, a first impurity region 31, a second impurity region 33, a third impurity region 35, and a high-resistance region 37 may be formed on the well 25.

The isolation layer 29 may be formed in an isolation trench 29T formed by partially patterning the well 25. The isolation layer 29 may include silicon oxide, silicon nitride, silicon oxynitride, or a combination thereof. The isolation layer 29 may be formed so as to have a thickness in a range of 100 nm to 3000 nm. The first impurity region 31, the second impurity region 33, the third impurity region 35, and the high-resistance region 37 may be formed by applying ion implanting methods using various energies and sources in the well 25. The first impurity region 31, the second impurity region 33, and the high-resistance region 37 may have a semiconductor such as single crystal silicon including second conductive type impurities. The third impurity region 35 may have a semiconductor such as single crystal silicon including the first conductive type impurities.

An interlayer insulating layer 40 which covers the first impurity region 31, the isolation layer 29, the second impurity region 33, the third impurity region 35, and the high-resistance region 37 may be formed on the substrate 21. The interlayer insulating layer 40 may include silicon oxide, silicon nitride, silicon oxynitride, low-K dielectrics, or a combination thereof.

A first plug 41, a second plug 43, and a third plug 45, which pass through the interlayer insulating layer 40, may be formed. The first plug 41, the second plug 43, and the third plug 45 each may include a metal, a metal silicide, a metal nitride, conductive carbon, a doped semiconductor, or a combination thereof.

Referring to FIG. 15, a first buried interconnection layer 23A may be formed on a substrate 21. A second buried interconnection layer 23B may be formed on the first buried interconnection layer 23A. For example, the first buried interconnection layer 23A may be formed using an ion implanting process in the substrate 21. The second buried interconnection layer 23B may be formed using an epitaxial growth method.

Wells 25A, 25B, 25C, 25D, and 25E may be formed on the second buried interconnection layer 23B. The wells 25A, 25B, 25C, 25D, and 25E may include a first region 25A, a second region 25B, a third region 25C, a fourth region 25D, and a fifth region 25E. The first region 25A, the second region 25B, the third region 25C, the fourth region 25D, and the fifth region 25E may be formed by applying ion implanting methods of various energies and doses.

Figure 22:
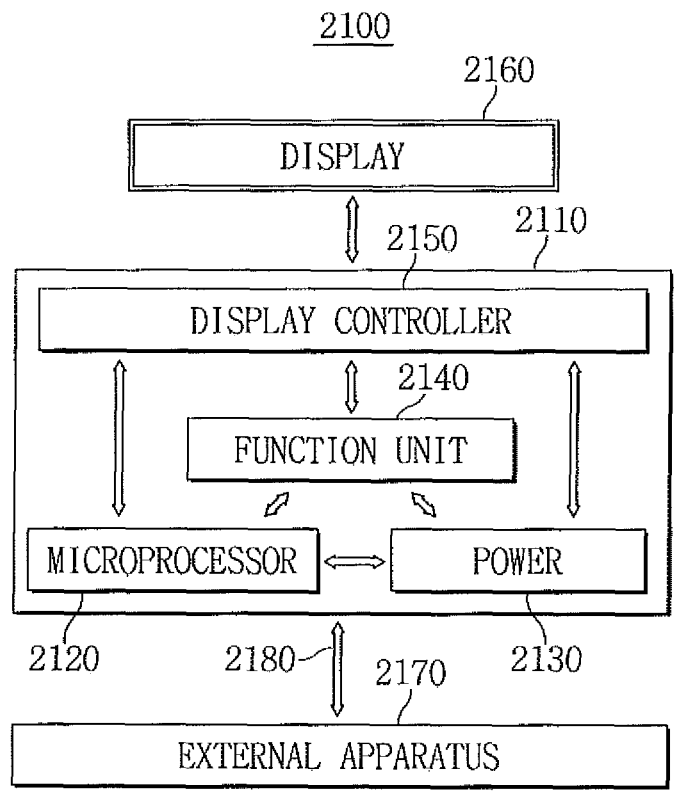
Figure 23:
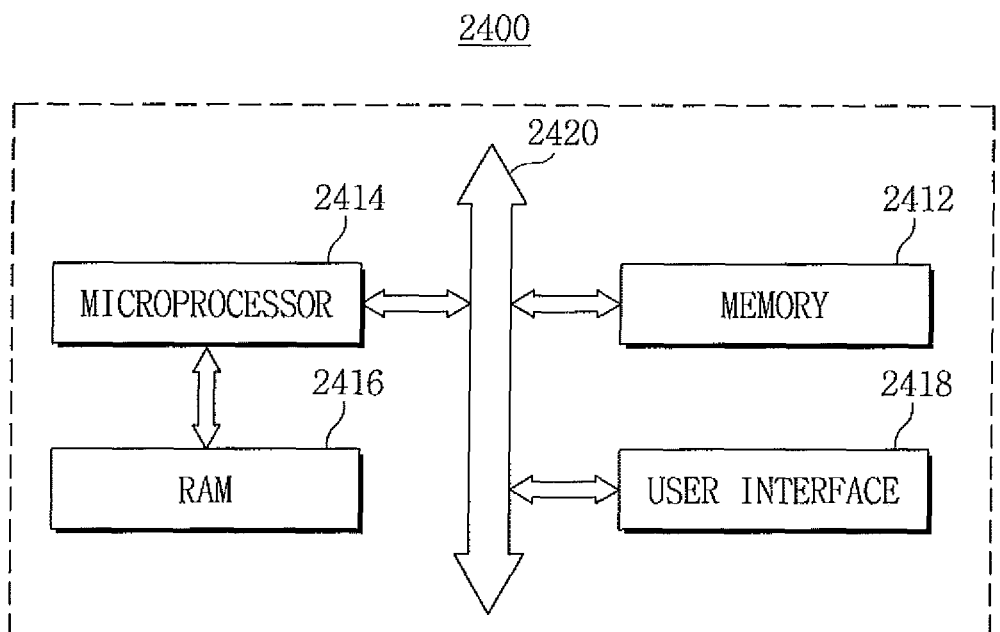

FIGS. 22 and 23 are block diagrams showing electronic systems further example embodiments.

Referring to FIG. 22, the semiconductor devices similar to those described with reference to FIGS. 1 to 21 may be applied to an electronic system 2100. The electronic system 2100 may include a body 2110, a microprocessor 2120, a power 2130, a function unit 2140, and a display controller 2150. The body 2110 may include a mother board formed by a printed circuit board (PCB). The microprocessor 2120, the power 213Q, the function unit 2140, and the display controller 2150 may be mounted on the body 2110. A display 2160 may be disposed inside or outside the body 2110. For example, the display 2160 may be disposed on a surface of the body 2110 and may display an image processed by the display controller 2150.

The power 2130 may receive a constant voltage from an external power supply, divide the voltage into various voltage levels, and supply the voltages to the microprocessor 2120, the function unit 2140, the display controller 2150, etc. The microprocessor 2120 may receive a voltage from the power 2130 to control the function unit 2140 and the display 2160. The function unit 2140 may perform various functions of the electronic system 2100. For example, when the electronic system 2100 is a smart phone, the function unit 2140 may include dialing, or various components to perform wireless communication functions such as video output to the display 2160 or voice output to a speaker through communication with an external apparatus 2170, and when a camera is included, the function unit 2140 may serve as a camera image processor.

In an application embodiment, when the electronic system 2100 is connected to a memory card to expand the capacity, the function unit 2140 may be a memory card controller. The function unit 2140 may exchange signals with the external apparatus 2170 through a wired or wireless communication unit 2180. Further, when the electronic system 2100 requires a Universal Serial Bus (USB) to expand the functions, the function unit 2140 may serve as an interface controller. In addition, the function unit 2140 may include a mass storage device.

The semiconductor devices similar to those described with reference to FIGS. 1 to 21 may be applied to the function unit 2140 or the microprocessor 2120. For example, the microprocessor 2120 may include the high-resistance region 37 (shown in FIG. 1).

Referring to FIG. 23, an electronic system 2400 may include at least one of the semiconductor devices in accordance with the embodiments of the inventive concepts. The electronic system 2400 may be used to manufacture a mobile device or a computer. For example, the electronic system 2400 may include a memory system 2412, a microprocessor 2414, a RAM 2416, a bus 2420, and a user interface 2418. The microprocessor 2414, the memory system 2412, and the user interface 2418 may be connected to each other through the bus 2420. The user interface 2418 may be used to input or output data to or from the electronic system 2400. The microprocessor 2414 may program and control the electronic system 2400. The RAM 2416 may be used as an operational memory of the microprocessor 2414. The microprocessor 2414, the RAM 2416, and/or other components may be assembled within a single package. The memory system 2412 may store operational codes of the microprocessor 2414, data processed by the microprocessor 2414, or data received from the outside. The memory system 2412 may include a controller and a memory.

The semiconductor devices similar to those described with reference to FIGS. 1 to 21 may be applied to the microprocessor 2414, the RAM 2416, or the memory system 2412.

According to the embodiments in accordance with the inventive concepts, a first impurity region, a high-resistance region, an isolation layer, a second impurity region, and a third impurity region are formed on a well. The high-resistance region is formed between the first impurity region and the isolation layer. The high-resistance region may serve to prevent a phenomenon in which electric fields are concentrated on an edge part of the first impurity region. Current paths between the first impurity region and the well can be substantially balanced due to an arrangement of the high-resistance region compared to a conventional method. Current drivability of the ESD protection device can be substantially improved compared to the conventional method.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims. For example, the semiconductor devices in accordance with the embodiments of the inventive concepts may include a bipolar transistor having a lateral PNP (LPNP) structure.

What is claimed is:

1. A semiconductor device, comprising:
    a well on a substrate;
    a first impurity region on the well, connected to an input/output pad;
    a second impurity region on the well, spaced apart from the first impurity region, and connected to a ground (Vss);
    a third impurity region on the well, spaced apart from the first impurity region, and connected to the ground (Vss);
    an isolation layer between the first impurity region and the second impurity region; and
    a high-resistance region between the first impurity region and the isolation layer, configured to directly contact the first impurity region and the well, and having a resistance higher than that of the first impurity region,
    wherein the well and the third impurity region include first conductive type impurities, and the first impurity region and the second impurity region include second conductive type impurities different from the first conductive type impurities, and
    wherein the high-resistance region comprises the second conductive type impurities.

2. The device according to claim 1, wherein an upper end of the high-resistance region is disposed at a level higher than a lower end of the first impurity region and a lower end of the high-resistance region is disposed at a level lower than the lower end of the first impurity region.

3. The device according to claim 1, wherein a lower end of the isolation layer is disposed at a level lower than a lower end of the first impurity region and a lower end of the high-resistance region is disposed at a level lower than the lower end of the isolation layer.

4. The device according to claim 1, wherein the high-resistance region overlaps a lower part of the isolation layer.

5. The device according to claim 1,
    wherein an atomic ratio of the second conductive type impurities in the high-resistance region is smaller than that of the second conductive type impurities in first impurity region.

6. The device according to claim 1, further comprising
    a fourth impurity region between the second impurity region and the isolation layer,
    the second impurity region is disposed between the third impurity region and the fourth impurity region and the fourth impurity region includes the first conductive type impurities.

7. The device according to claim 1, further comprising:
    a lower plug on the third impurity region;
    a resistance pattern on the lower plug; and
    an upper plug on the resistance pattern,
    wherein the upper plug is connected to the ground (Vss) and the third impurity region is disposed between the isolation layer and the second impurity region.

8. The device according to claim 1, the well comprises:
    a first region;
    a second region on the first region, having a resistance lower than that of the first region; and
    a third region on the second region, having a resistance lower than that of the first region,
    wherein the second region and the third region partially overlap a lower part of the first impurity region and the first region surrounds a bottom and side surfaces of the high-resistance region.

9. The device according to claim 8, wherein the first region directly contacts the first impurity region between the high-resistance region and the third region.

10. The device according to claim 8, wherein the third region is disposed between the first impurity region and the second region and the third region has a resistance higher than that of the second region.

11. The device according to claim 8, wherein an atomic ratio of the first conductive type impurities in the third region is greater than that of the first conductive type impurities in the first region and smaller than that of the first conductive type impurities in the second region.

12. The device according to claim 8, the well further comprises:
    a fourth region on the first region, having a resistance lower than that of the first region; and
    a fifth region on the fourth region, having a resistance lower than that of the first region,
    wherein the fourth region and the fifth region overlap the second impurity region, the third impurity region, and the isolation layer.

13. The device according to claim 12, wherein the fifth region has a resistance higher than that of the fourth region.

14. The device according to claim 12, wherein an atomic ratio of the first conductive type impurities in the fifth region is greater than that of the first conductive type impurities in the first region and smaller than that of the first conductive type impurities in the fourth region.

15. The device according to claim 12, wherein a distance between the fourth region and the high-resistance region is greater than a distance between the fifth region and the high-resistance region.

16. A semiconductor device, comprising:
    a well on a substrate;
    a first impurity region on the well, connected to an input/output pad;
    a second impurity region on the well, spaced apart from the first impurity region, and connected to a ground (Vss);
    a third impurity region on the well, spaced apart from the first impurity region, and connected to the ground (Vss); and
    an isolation layer between the first impurity region and the second impurity region;
    the well and the third impurity region include first conductive type impurities, the first impurity region and the second impurity region include second conductive type impurities different from the first conductive type impurities, and the well comprises:
    a first region;
    a second region on the first region, having a resistance lower than that of the first region;
    a third region on the second region, having a resistance lower than that of the first region,
    a fourth region on the first region, having a resistance lower than that of the first region; and
    a fifth region on the fourth region, having a resistance lower than that of the first region,
    wherein the second region and the third region partially overlap a lower part of the first impurity region, the fourth region and the fifth region overlap the second impurity region, the third impurity region, and the isolation layer, and the first region between the third region and the fifth region directly contacts the isolation layer and the first impurity region.

17. The device according to claim 16, further comprising
    a fourth impurity region between the first impurity region and the isolation layer, wherein the fourth impurity region includes the first conductive type impurities.

\* \* \* \* \*